United States Patent
Oh et al.

(10) Patent No.: US 7,130,325 B2
(45) Date of Patent: Oct. 31, 2006

(54) SAMPLED GRATING DISTRIBUTED FEEDBACK WAVELENGTH TUNABLE SEMICONDUCTOR LASER INTEGRATED WITH SAMPLED GRATING DISTRIBUTED BRAGG REFLECTOR

(75) Inventors: Su Hwan Oh, Daejeon-Shi (KR); Moon Ho Park, Daejeon-Shi (KR); Ji Myon Lee, Daejeon-Shi (KR); Ki Soo Kim, Jeonju-Si (KR); Chul Wook Lee, Daejeon-Shi (KR); Hyun Sung Ko, Daejeon-Shi (KR); Sahng Gi Park, Daejeon-Shi (KR); Young Chul Chung, Seoul (KR); Su Hyun Kim, Seoul (KR)

(73) Assignee: Electronics and Telecommunications Research Institute, KRX ( * ) Notice: Subject to any disclaimer, the term of this patent is extended or adjusted under 35 U.S.C. 154(b) by 203 days.

(21) Appl. No.: 10/749,043

(22) Filed: Dec. 29, 2003

(65) Prior Publication Data

US 2004/0218639 A1 Nov. 4, 2004

(30) Foreign Application Priority Data

May 2, 2003 (KR) .................... 10-2003-0028186

(51) Int. Cl.
*H01S 5/00* (2006.01)
*H01S 3/08* (2006.01)
(52) U.S. Cl. ..................................... 372/96; 372/50.11
(58) Field of Classification Search ............. 372/50.11, 372/96
See application file for complete search history.

(56) References Cited

U.S. PATENT DOCUMENTS

| 4,896,325 | A | | 1/1990 | Coldren |
| 5,325,392 | A | | 6/1994 | Tohmori et al. |
| 5,379,318 | A | * | 1/1995 | Weber .......................... 372/96 |
| 6,215,805 | B1 | * | 4/2001 | Sartorius et al. ........... 372/50.1 |

FOREIGN PATENT DOCUMENTS

EP 0717480 6/1999

(Continued)

OTHER PUBLICATIONS

"Asymmetric Sampled Grating Laser Array for a Multiwavelength WDM Source", S. Ryu, et al., 2002 IEEE, vol. 14, No. 12, Dec. 2002.

(Continued)

*Primary Examiner*—Armando Rodriguez
(74) *Attorney, Agent, or Firm*—Blakely Sokoloff Taylor & Zafman

(57) ABSTRACT

The present invention relates to a semiconductor laser, having a construction capable of tuning a wavelength, in which a sampled grating distributed feedback SG-DFB structure portion and a sampled grating distributed Bragg reflector SG-DBR structure portion are integrated. In the present invention, the refraction index are varied in accordance with a current applied to the phase control area in the SG-DFB structure portion and the SG-DBR structure portion, whereby it is possible to continuously or discontinuously tune the wavelength. Therefore, in such a wavelength tunable semiconductor laser, its construction is relatively simple, and it is relatively useful to the manufacturing and mass-producing the semiconductor laser. In addition, such a wavelength tunable semiconductor laser has an excellent output optical efficiency while making it possible to tune the wavelength of the wide band.

8 Claims, 7 Drawing Sheets

FOREIGN PATENT DOCUMENTS

| | | |
|---|---|---|
| JP | 01-319986 | 12/1989 |
| JP | 07-273400 | 10/1995 |
| JP | 11-340566 | 12/1999 |
| JP | 2003-017803 | 1/2003 |

OTHER PUBLICATIONS

"Demonstration of broadband tunability in a semiconductor laser using sample gratings"; Appl. Phys. Lett 60, May 11, 1992, pp. 2321-2323.

* cited by examiner

SAMPLED GRATING DISTRIBUTED FEEDBACK WAVELENGTH TUNABLE SEMICONDUCTOR LASER INTEGRATED WITH SAMPLED GRATING DISTRIBUTED BRAGG REFLECTOR

BACKGROUND OF THE INVENTION

1. Field of the Invention

The present invention relates to a structure of a wavelength tunable semiconductor laser, and more specifically to a semiconductor laser capable of tuning a wavelength by integrating a sampled grating distributed feedback Bragg (SG-DFB) structure and a sampled grating distributed Bragg reflector (SG-DBR) structure.

2. Description of the Prior Art

Recently, the text data basis is moved into the multi-media data basis in a communication contents with wide use of Internet, and thus the data transmission rate and capacity required are largely increased. Furthermore, as one method of expanding a transmission bandwidth, a method of transmitting an optical signal using a wavelength division manner is used. This method is to concurrently send the different informations having different wavelengths through an optical fiber, thereby largely expanding the bandwidth of a single optical fiber. In addition, according to this method, it is possible to reduce cost for installing the optical fiber and to implement a more flexible and more expandable optical network. Therefore, this method will be an essential transmission method in the future of an optical communication network.

In such a WDM optical communication system, when a wavelength tunable semiconductor laser diode instead of a fixed wavelength semiconductor laser diode is used as a light source, there are several advantages in the system. Specifically, it is possible to reduce the number of the light source for back-up for maintaining the system and simplify the network control software as well as dynamically provide a wavelength. In addition, as a dense WDM (that is, the DWDM), in which the interval between wavelengths of the WDM optical communication system is 0.8 nm or 0.4 nm, is gradually developed, the wavelength tunable laser diode has several economical advantages in comparison with single wavelength laser diodes for generating fixed wavelengths, respectively.

As representative wavelength tunable laser diode having been proposed up to now, there are a sampled grating distributed Bragg reflector (SG-DBR) laser diode, a superstructure grating distributed Bragg reflector (SSG-DBR) laser diode, a grating-assisted codirectional-coupler with sampled grating reflector (GCSR) laser diode, and so on.

Now, the conventional wavelength tunable semiconductor laser will be described with reference to the appended drawings.

FIG. 1 is a constructional view of a sampled grating distributed Bragg reflector (SG-DBR) laser diode disclosed in U.S. Pat. No. 4,896,325.

The wavelength tunable laser diode shown in FIG. 1 comprises total four areas, that is, SG-DBR areas 140, 142 at both sides of the wavelength tunable laser diode, and a gain area 136 and a phase control area 132 in which an optical wave is generated. Furthermore, in order to tune a wavelength of such a SG-DBR laser diode, a Vernier control circuit 148 for continuously tuning a wavelength, an offset control circuit 150 for discontinuously tuning a wavelength, a phase control circuit 146 in a phase area, and a gain control circuit 144 are needed.

As described above, according to the fundamental operation principle of such a laser diode, it is possible that the optical wave distributed over a wide wavelength range is oscillated at a special wavelength band by making only the optical wave with the special wavelength band resonate. In other words, the SG-DBR areas 140, 42 are integrated at both sides of the gain area so that only the selected special wavelength band resonates to be tuned.

The SG-DBR areas 140, 142 have the sampled diffraction grating construction as shown in FIG. 2 and the reflected spectrum characteristics as shown in FIG. 3. A central peak of the reflected spectrum is a Bragg wavelength $\lambda_B$ determined by a diffraction grating pitch (period) $\lambda$, and an interval between the peaks is determined by a period Z of the sampled grating (SG). In other words, the laser diode can be oscillated at the matched peak of the several peaks in both sides by integrating the SG-DBR areas having the different SG periods Z from one another in the both sides of the laser diode.

Furthermore, it is possible to vary the refraction index in the SG-DBR area to vary the matched peak, so that the oscillation wavelength can be tuned. The phase control area 132 adjusts an interval between longitudinal modes of the gain area 136 generated by the SG-DBR to continuously tune the wavelength or match the longitudinal modes with the reflection peak, so that the power of the oscillation wavelength is maximized. According to this principle, it is possible to appropriately adjust the refraction index of the SG-DBR areas 140, 142 in both sides of the laser diode and the phase control area 132 using a current, so that the wavelength can be continuously or discontinuously tune.

However, in order to tune the wavelength of such a SG-DBR laser diode, since various control circuits such as a Vernier control circuit 148, an offset circuit 150 for shifting a discontinuous wavelength, a phase control circuit 146 in a phase area, a gain control circuit 144, etc. are needed, there is a problem that a laser diode module and a system circuit are complex.

In addition, there is a constructional problem that the optical output efficiency is reduced due to the optical loss generated in the SG-DBR areas 140, 142 of the both sides of the laser diode. In order to overcome these problems, investigations for incorporating semiconductor optical amplifier (SOA) into the SG-DBR laser diode have been actively progressed. However, there is a problem that the construction of the laser diode is more complex, so that it is difficult to produce the laser diode.

On the other hands, a SSG-DBR laser diode disclosed in U.S. Pat. No. 5,325,392 will be described with reference to FIGS. 4 and 5.

The SSG-DBR laser diode disclosed in the U.S. Pat. No. 5,325,392 comprises SSG-DBR areas at both sides for tuning the wavelength, a gain area and a phase control area, similarly to the SG-DBR laser diode shown in FIG. 1. The diffraction grating in the SSG-DBR laser diode is constructed to have a construction obtained by modulating a diffraction grating period repeatedly at the special period Z as shown in FIG. 4. Therefore, according to this construction, the reflected spectrum has the interval between reflection peaks determined by the period Z as shown in FIG. 5 and each reflection peak has a large and constant value even with a small coupling coefficient due to modulation of the period.

Such a SSG-DBR laser diode has a wide wavelength tunable area and a constant power in accordance with the tuned wavelength. However, the SSG-DBR laser diode has a constructional limit due to the SSG-DBR areas at the both sides similarly to the SG-DBR laser diode, so that it is difficult to produce the SSG-DBR laser diode due to the complex structure of the diffraction grating.

As a conventional wavelength tunable laser diode other than the aforementioned wavelength tunable laser diode, there are a GCSR laser diode, a wavelength tunable twin-guide laser diode, and so on. However, in such laser diodes, since a re-growth process and an etching process must be repeated to produce the laser diodes, there is a problem that it is difficult to produce the laser diodes and thus the laser diodes are it is not suitable for mass production.

In brief, the conventional wavelength tunable laser diode has problems that the structure thereof is complex, the output optical efficiency is low, and the wavelength tunable control is complex.

SUMMARY OF THE INVENTION

The present invention is therefore contrived to solve the above problems, and it is an object of the present invention to provide a wavelength tunable semiconductor laser having a new structure which can be used as a light source for a WDM optical communication system.

It is another object of the present invention to provide a wavelength tunable semiconductor laser, wherein its structure is relatively simple, it is advantageous for manufacturing and mass-producing the laser, and a manufacturing method which is not largely departed from the verified conventional method can be used.

It is still another object of the present invention to provide a semiconductor laser excellent in output optical efficiency while enabling to tune the wavelength in the wide band.

As a means for solving the problems described above, a wavelength tunable semiconductor laser diode according to the present invention, comprises: a SG-DFB structure portion including a gain area having a sampled diffraction grating (SG) of a first period and a phase control area provided between the sampled gratings; and a SG-DBR structure portion being integrated with the SG-DFB structure portion and being provided with a sampled diffraction grating of a second period. In addition, the wavelength tunable semiconductor laser further comprises an upper cladding layer formed on the whole structure, and electrodes for independently applying voltage to a lower portion of the substrate, a gain area, a phase control area and the SG-DBR area. Furthermore, according to the present invention, non-reflection thin films are formed on the left and right end surface of the laser diode having such a construction. Therefore, in the present invention, it is possible to continuously or discontinuously tune an oscillated wavelength in accordance with change of the refraction index in the phase control area and/or the SG-DBR area. The substrate can be an n type InP substrate, the wave guide layer can be made of an InGaAsP group material, and the upper cladding layer can be mad of a p type InP.

Preferably, the sampled diffraction grating of the first period and the sampled diffraction grating of the second period have the same pitches, and the first period and the second period are different.

Preferably, the refraction indexes in the phase control area and/or the SG-DBR area are changed with applying current.

On the other hands, the aforementioned wavelength tuned semiconductor laser can be integrated with an optical converter, and if need be, an optical amplifier in one semiconductor substrate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF EMBODIMENTS

Now, an embodiment according to the present invention will be described in detail with reference to the appended drawings. However, the present invention is not limited to the embodiment disclosed in the following description, but can be implemented into various changes and modifications. Thus, this embodiment according to the invention is disclosed and provided for completely informing those skilled in the art of the scope of the present invention.

Figure 6:
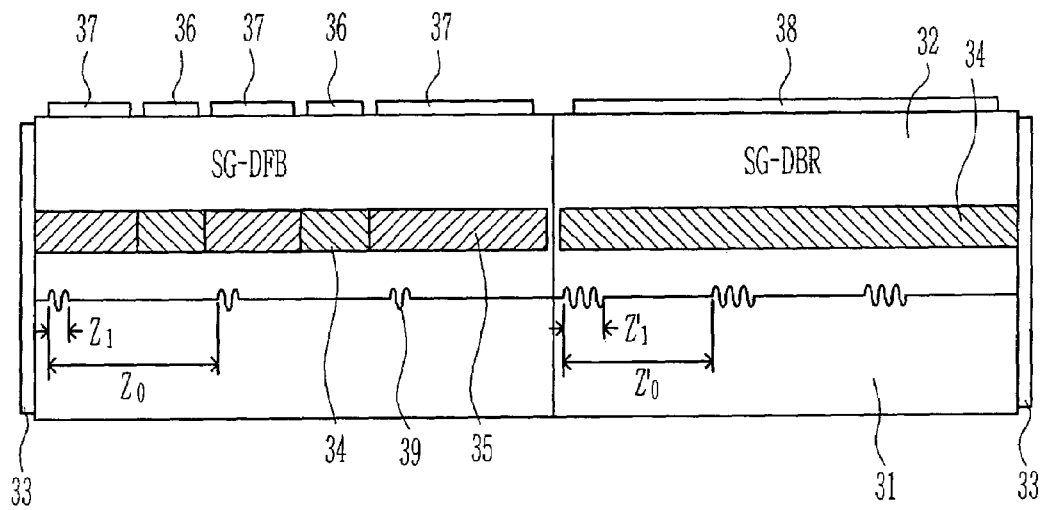
FIG. 6 is a constructional view schematically showing a wavelength tunable semiconductor laser according to a preferred embodiment of the present invention.

FIG. 6 is a constructional view schematically showing a wavelength tunable semiconductor laser according to the preferred embodiment of the present invention. In FIG. 6, the SG-DFB structure portion and the SG-DBR are integrated in the wavelength tunable semiconductor laser.

The wavelength tunable semiconductor laser makes it possible to continuously or discontinuously tune the wavelength of the wide range depending on change of the refraction indexes in the phase control area of the SG-DFB structure portion and the SG-DBR area of the SG-DBR structure portion.

Referring to FIG. 6, the semiconductor laser diode of this embodiment is divided into an area having the SG-DFB structure portion and an area having the SG-DBR structure portion.

The SG-DFB structure portion comprises an n type InP substrate 31 being used as a lower cladding layer, a sampled grating 39 being formed on the n type InP substrate 31, and a phase control area of an InGaAsP wave guide layer 34 and a gain area of an active layer 35 being capable of implementing multiple quantum well structures on the sampled grating 39. In addition, a p type InP cladding layer 32 being used as an upper cladding layer is formed on the gain area, electrodes are formed on the p type InP cladding layer 32, a phase control area electrode 36 is formed on the phase control area, and a gain area electrode 37 is formed on the gain area. Furthermore, a non-reflection thin film 33 is formed on one end surface of the semiconductor laser diode. The gain area and the phase control area can be made of materials of for example InGaAsP group, for example. In this time, band gaps of the gain area and the phase control area may be different. For example, the gain area can be made of an InGaAsP having a band gap wavelength of 1.55 μm and the phase control area can be made of an InGaAsP having a band gap wavelength of 1.3 μm.

The SG-DFB structure portion comprises a n type InP substrate 31 being used as a lower cladding layer, a sampled grating being formed on the n type InP substrate 31, and a phase control area of an InGaAsP wave guide layer 34 and a p type InP cladding layer 32 being used as a upper cladding layer on the sampled grating. In addition, electrodes 38 of the SG-DBR are formed on the phase control area. Furthermore, a non-reflection thin film 33 may be provided on one end surface of the semiconductor laser.

The gain area of the semiconductor laser generates an optical wave using a spontaneous emission. The energy of the generated optical wave is distributed over the wide wavelength range about a special wavelength. In order to generate the optical wave, its energy being concentrated on the special wavelength, the optical wave should be generated using the stimulated emission. The stimulated emission is generated through a resonance of the optical wave within the semiconductor laser diode, and conditions of the resonance are determined by characteristics of the effective reflectivity. In other words, the laser diode is oscillated in the wavelength having the highest effective reflectivity. Furthermore, the laser diode is easily oscillated in a single mode with increase in difference between the effective reflectivity of the wavelength corresponding to a peripheral mode and the highest effective reflectivity. The oscillated wavelength of the laser diode can be tuned according to the location change of a spectrum peak with the effective reflectivity.

Figure 1:
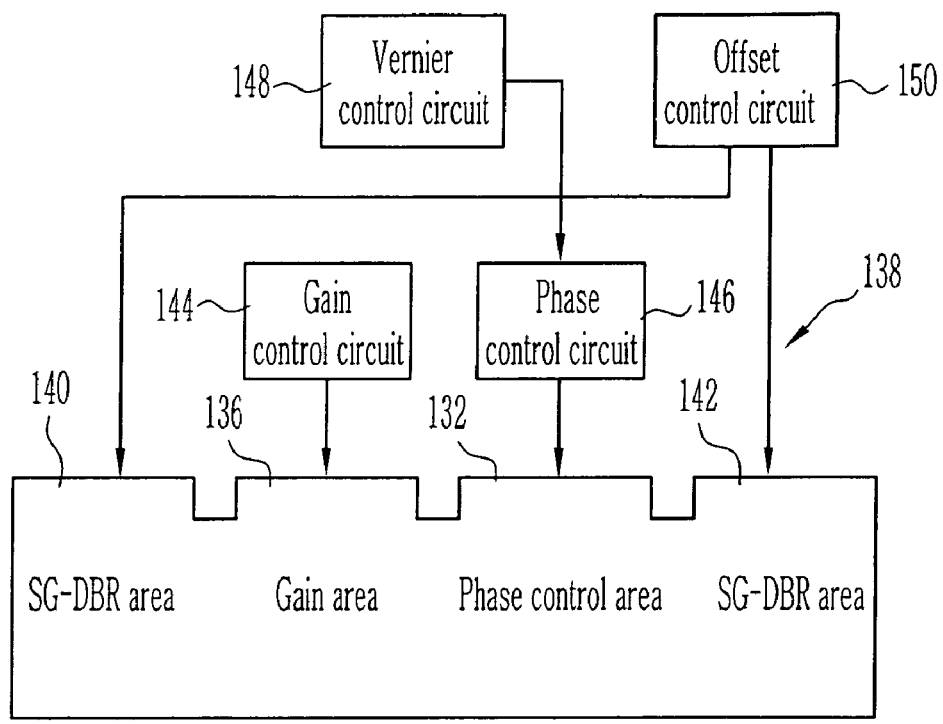
FIG. 1 is a constructional view schematically showing a semiconductor laser integrated with a conventional sampled grating distributed Bragg reflector (SG-DBR)
Figure 2:
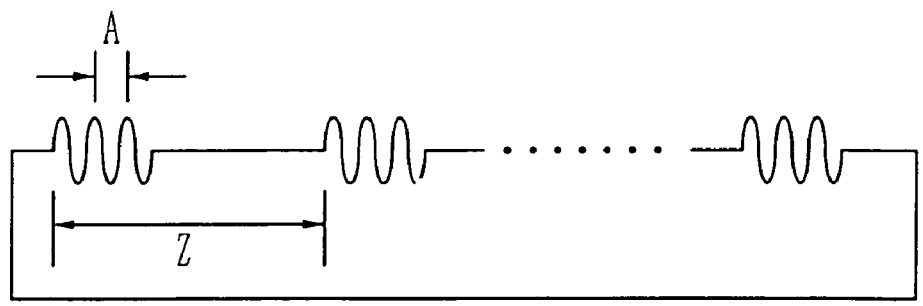
FIG. 2 is a conceptional view of a diffraction grating in the semiconductor laser integrated with the conventional sampled grating distributed Bragg reflector (SG-DBR) in FIG. 1.
Figure 3:
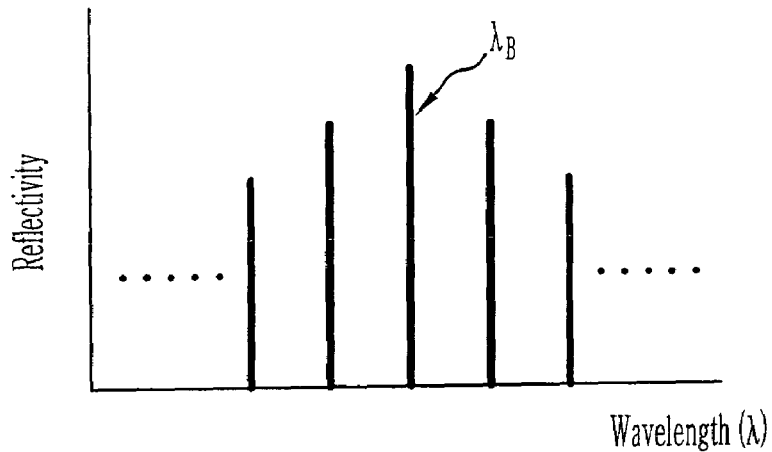
FIG. 3 is a view schematically showing a reflected spectrum in the semiconductor laser integrated with the SG-DBR in FIG. 1.
Figure 4:
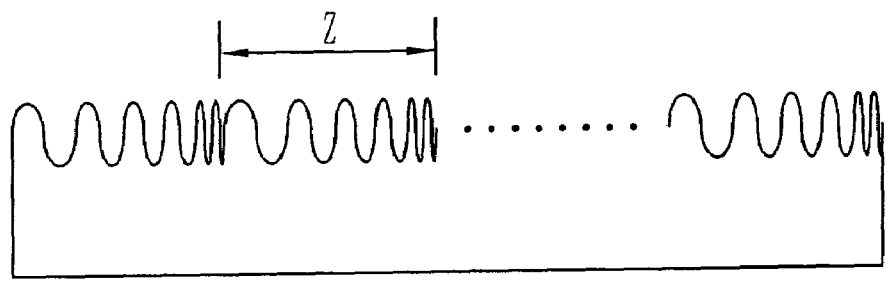
FIG. 4 is a conceptional view of a sampled diffraction grating in a semiconductor laser integrated with a conventional super structure grating distributed Bragg reflector SSG-DBR.
Figure 5:
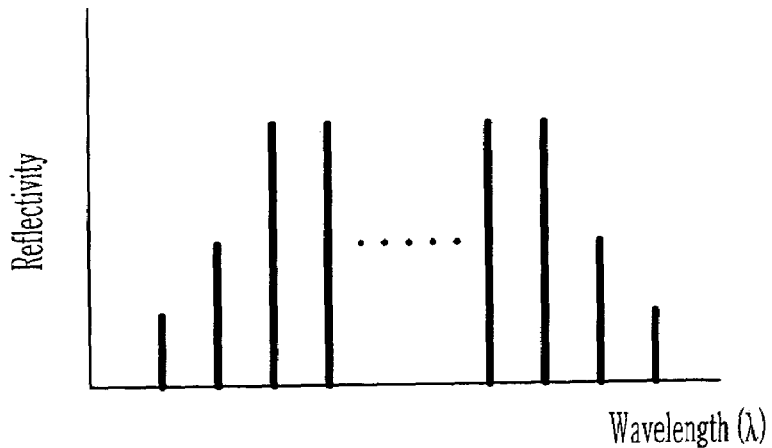
FIG. 5 is a view schematically showing a reflected spectrum in the SSG-DBR semiconductor laser in FIG. 4.
Figure 7:
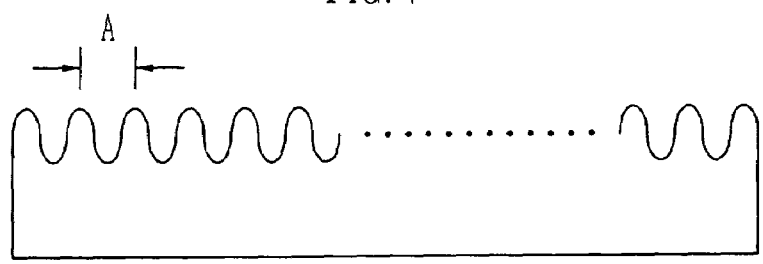
FIG. 7 is a conceptional view of a diffraction grating in a distributed feedback Bragg (DFB) semiconductor laser.
Figure 8:
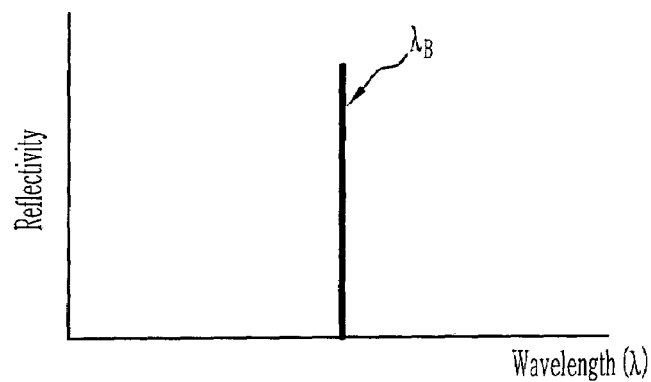
FIG. 8 is a view schematically showing a reflected spectrum in the distributed feedback Bragg semiconductor laser in FIG. 7.

On the other hands, the DFB semiconductor laser has a structure of forming a diffraction grating with a constant pitch (or period) as shown in FIG. 7 in the gain area. The reflected spectrum of such a diffraction grating has characteristics that the reflectivity is high at a Bragg wavelength $\lambda_B$ as shown in FIG. 8. If a non-reflection coating film is formed on the both sides of a resonator, the reflection is generated only at the diffraction grating. In this case, since the effective reflectivity is very high at adjacent of the Bragg wavelength, the oscillation is generated at adjacent of the Bragg wavelength. However, other than that case, in the case of a sample grating distributed feedback (SG-DFB) laser having a diffraction grating construction which is a sampled grating SG construction as shown in FIG. 2 in the resonator, it is possible that an oscillation is generated at a reflection peak since a reflected spectrum becomes as shown in FIG. 3. In other words, the oscillation may be generated with multiple modes, in this time the interval between the modes is equal to the interval between the reflection peaks of the reflected spectrum in the SG and can be obtained by an equation 1 as followed:

$$\Delta\lambda = \lambda^2/2n_g z.  \qquad [\text{Equation 1}]$$

Here, $n_g$ indicates a group refraction index.

On the other hands, the phase control area of the SG-DFB structure portion makes it possible to shift the oscillation wavelength by moving the reflection peak in accordance with change of the refraction index. Furthermore, the phase control area also makes it possible to move the reflection peak of the Bragg reflector by changing the refraction index of the SG-DBR structure portion. The description with respect to these will be described later. Since a period of the sample grating SG is not less than several tens μm, the period can be controlled using a general photo transferring method. The interval between the reflection peaks in the SG-DFB structure portion (or the interval between the oscillation modes) and the interval between the reflected spectrums in the SG-DBR structure portion are deferent sine the SG periods are different.

Now, an operation principle of this wavelength tunable semiconductor laser of the present invention will be described with reference to the appended FIGS. 9 to 11.

Figure 9:
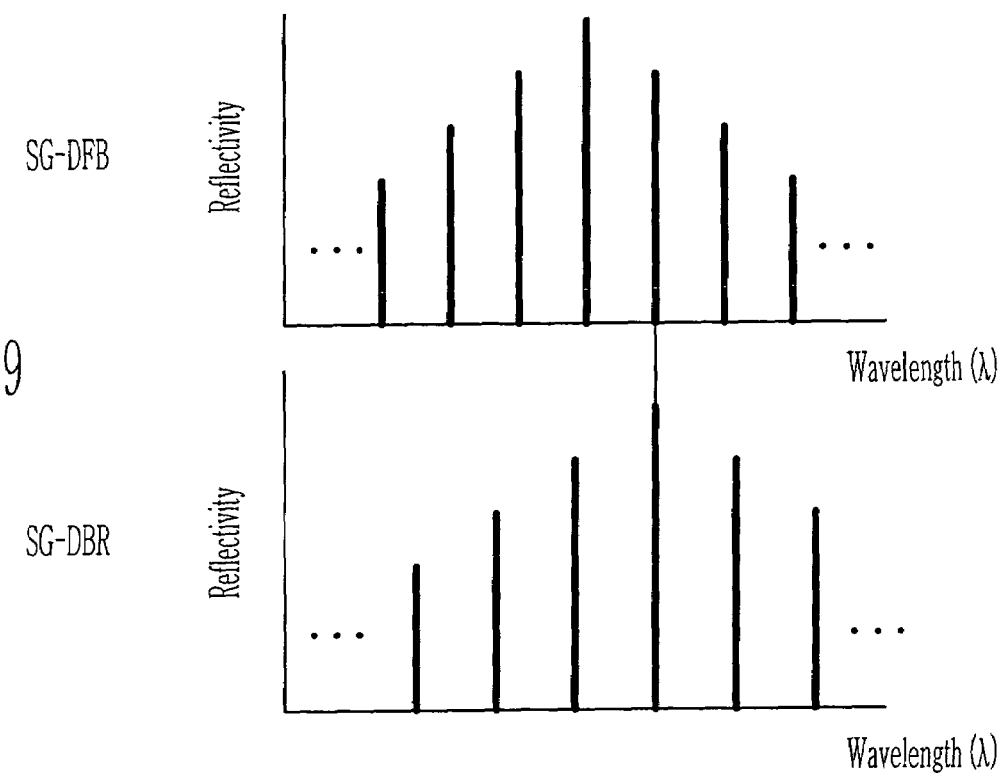
FIG. 9 is a view schematically showing the reflected spectrums in the SG-DFB structure portion and the SG-DBR structure portion in the case that change of the refraction index in the phase control area of the SG-DFB structure portion and the SG-DBR area does not exist.

FIG. 9 is a view showing reflected spectrums in the SG-DFB structure portion and the SG-DBR structure portion in the case that the refraction index in the phase control area of the SG-DFB structure portion and the SG-DBR area are not changed. In the case that the refraction index in the phase control area and the SG-DBR area are not changed, an oscillation is generated at the wavelength in which the SG-DFB structure portion and the SG-DBR structure portion have the same reflection peaks. Here, both areas mentioned above have the same diffraction grating pitches (or periods) (Lambda). However, since the characteristics of each of the mediums in the both areas are different, the Bragg wavelengths $\lambda_B$ of each of the reflected spectrums, that is, locations of the maximum reflection peak are different as shown in FIG. 9.

Figure 10:
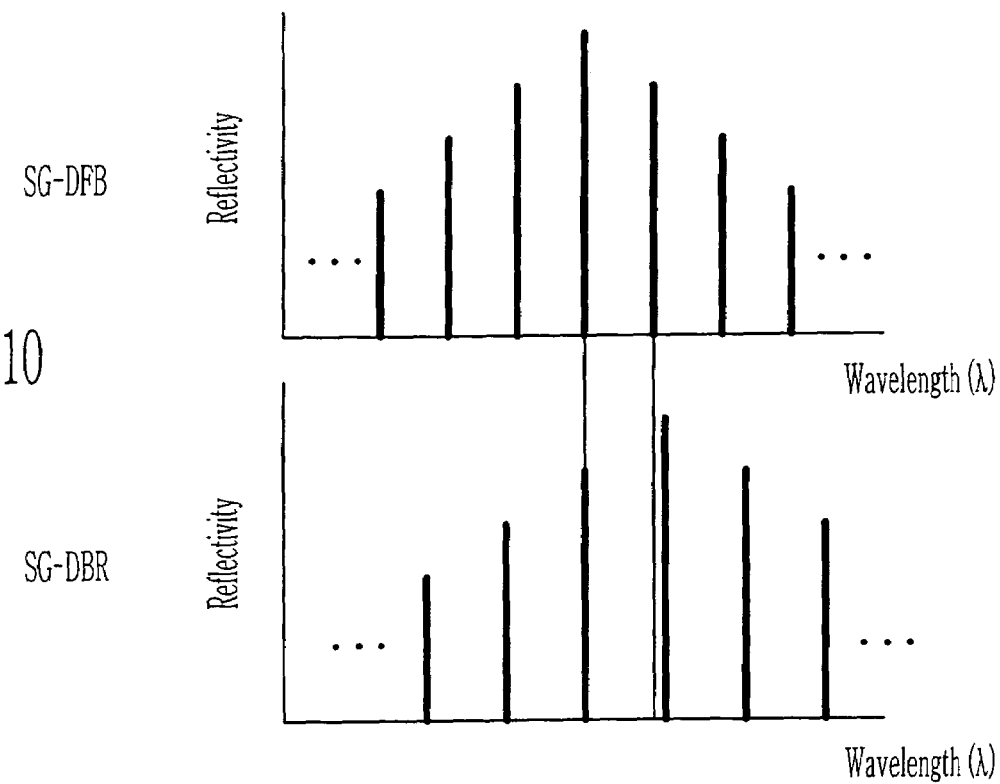
FIG. 10 is a view schematically showing a reflected spectrum in the case that only the refraction index of the SG-DBR area is varied.

FIG. 10 is a view schematically showing the reflected spectrums in the SG-DFB structure portion and the SG-DBR structure portion in the case that only the refraction index in the SG-DBR area is changed. When a current is applied to the SG-DBR area so that the refraction index of the medium is changed, the location of the reflection peak of the SG-DBR area can be moved. FIG. 10 is showing the case that the location of the reflection peak moves in right direction. Accordingly, the matched peaks, according to change of the location of the reflection peak of the SG-DBR area, are also changed and the oscillated wavelength is also changed. In such a manner, the oscillation modes of the SG-DFB structure portion can be sequentially selected with changing in the refraction index in the SG-DBR area, thereby the oscillation wavelength also being sequentially changed.

Figure 11:
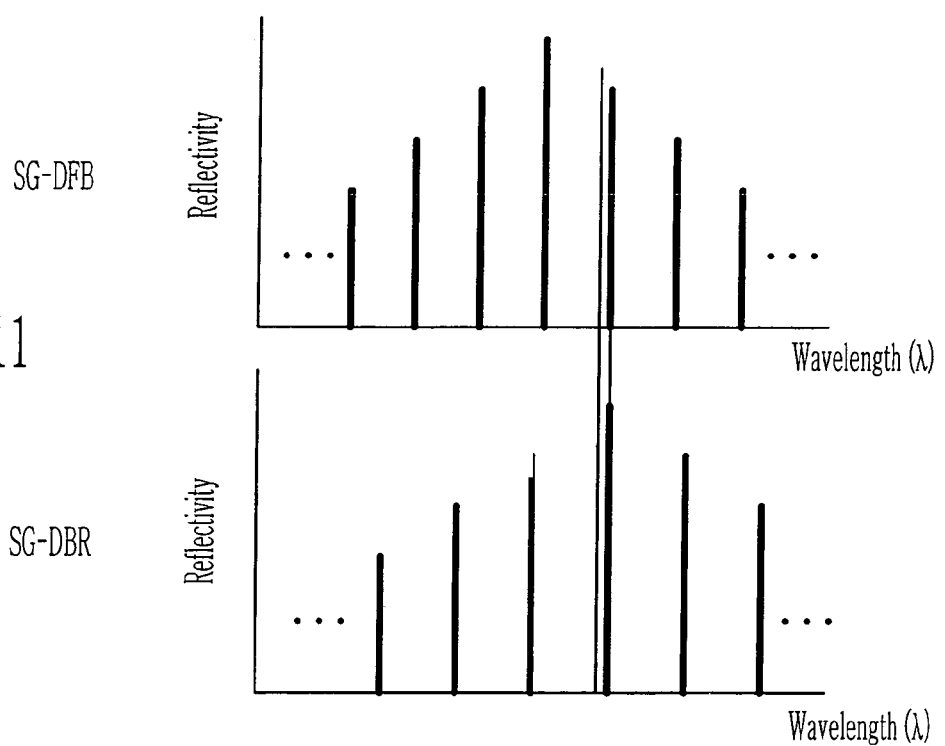
FIG. 11 is a view schematically showing the reflected spectrums in the case that the refraction index in the phase control area of the SG-DFB structure portion and the SG-DBR area are varied.

FIG. 11 is a view schematically the reflected spectrum of the SG-DFB structure portion and the SG-DBR structure portion in the case that the refraction index in the phase control area of the SG-DFB structure portion and the SG-DBR area are changed. In this figure, the refraction indexes are largely moved with changing in the refraction index of the phase control area in the SG-DFB structure portion.

When the refraction index of the SG-DBR area is also changed and therefore the reflection peak in the SG-DFB structure portion is moved by the changed quantity of the reflection peak of the SG-DFB structure portion, the matched wavelength is varied as shown in FIG. 11. In this manner, it is possible to continuously or discontinuously tune the wavelength.

Figure 12:
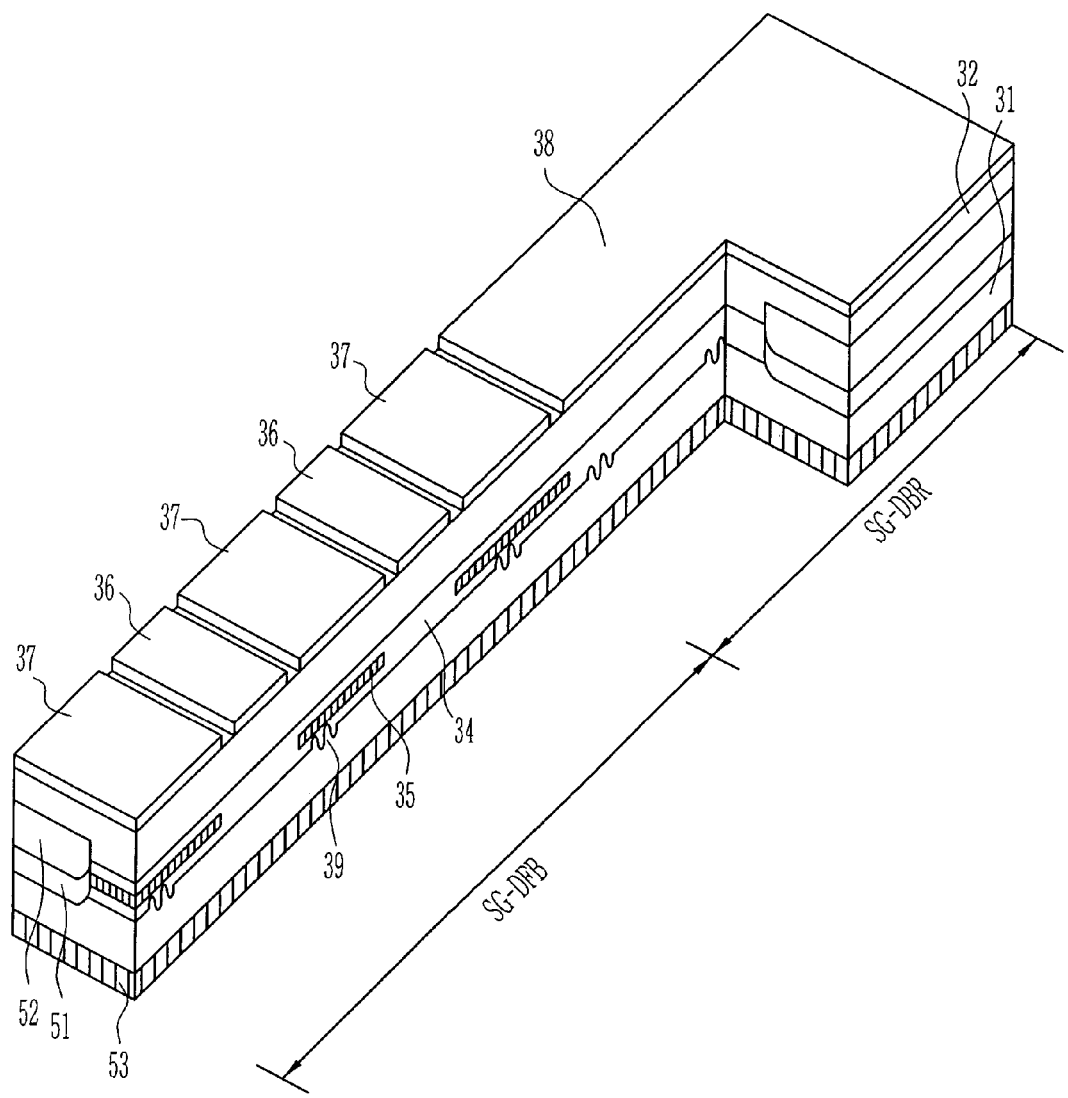
FIG. 12 is a cross-sectional view of implementing the wavelength tunable semiconductor laser according to an embodiment of the present invention using a general buried type laser diode.

FIG. 12 is a cross-sectional view of implementing the wavelength tuned semiconductor laser according to the embodiment of the present invention using a general buried type laser diode. The components indicated by the numerals used in FIG. 12 are similar to the components indicated by the numerals in FIG. 6.

The wavelength tunable semiconductor laser is divided into an area having the SG-DFB structure portion provided on the n type electrodes 53 and an area having the SG-DBR structure portion. For example, the wavelength tunable semiconductor laser comprises an InGaAsP wave guide layer 34; an active layer 35; a n type InP substrate 31 including a sampled grating 39; a p type InP cladding layer 32 and electrodes 36, 37 and 38. On the other hands, the n type and p type current breaking layers 51, 52 are formed around one end surface of each of the n type InP substrate 31 and the p type InP cladding layer 32. A non-reflection thin film (not shown) can be formed on each of the end surfaces of the semiconductor laser.

On the other hands, the area being provided with the SG-DFB structure portion and the area being provided with the SG-DBR structure portion have the same diffraction gating pitches (or periods), and the periods Z of the SGs are different.

Figure 13:
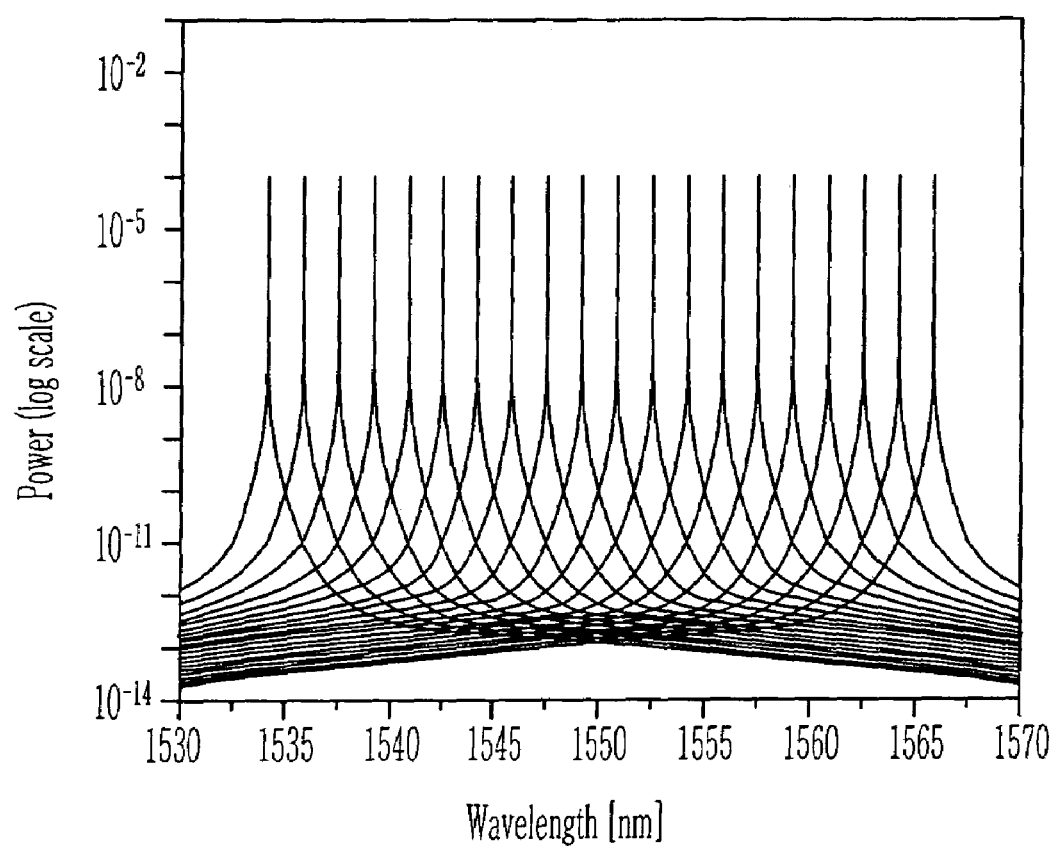
FIG. 13 is a graph showing the variation of an oscillation wavelength in the case that the refraction index of the SG-DBR area is changed in the computer simulation test.

FIG. 13 is a graph showing change of the oscillated wavelength in the case that the refraction index of the SG-DBR area in the SG-DBR structure portion is changed in the computer simulation test. As one of the computer simulation test for confirming whether the laser diode has the aforementioned wavelength tunable characteristic or not, an operator split-step time-domain model, which disclosed in a paper entitled by "An efficient split-step time-domain dynamic modeling of DFB/DBR laser diodes", IEEE J. of Quantum Electronics, Vol. 36, No. 7, pp. 787–794, July 2000 and written by B. S. Kim; Y. Chung: J.-S. Lee. It is known that this model is an effective model for analyzing the DFB/DBR laser diode.

In the computer simulation test, it has been assumed that the periods of the SG in the SG-DFB structure portion and the SG-DBR structure portion are 202.5 μm and 192 μm, respectively, the number of the SGs in the each of the areas are 3, the pitch (or period) of the diffraction grating is 240 nm, and length of the whole element is 1183.5 μm. Then, the variation of the oscillation wavelength was observed with changing the refraction index in the SG-DBR area from −0.015 to 0.015.

As shown in FIG. 13, the oscillated wavelength was oscillated with interval of 200 GHz (that is, 1.6 nm) according to the change of the refraction index. As known in the result, it was confirmed that the aforementioned interval was equal to the reflection peak interval obtained by the equation 1 in the SG-DFB structure portion.

As a modification of the present invention, there is one semiconductor substrate in which the wavelength tunable laser diode is integrated with an optical modulator. In other words, the optical signals, being modulated by applying any signals to an electro-absorber area integrated into the output portion of the proposed laser diode, can be used as the light source for the long distance communication since the optical signal has almost no problems with respect to frequency chirping. Although the technical spirit of the present invention has been specifically described in the preferred embodiments, it should be noted that the preferred embodiments are only for exemplifying the present invention, but not for limiting the present invention. Furthermore, the skilled in the art can understand that various changes and modifications of the present invention may be made without departing from the technical spirit and the scope of the present invention.

As described above, the present invention proposes a semiconductor laser having the construction, in which the SG-DFB structure portion enabling to suitably adjust a period of the SG and the SG-DBR structure portion are integrated, capable of tuning a wavelength of a phase control area in the SG-DFB structure portion.

Such a semiconductor laser has a simple construction in comparison with the conventional semiconductor, and can be produced using the conventional processes without any other new processes. Specifically, this semiconductor laser has a construction capable of directly transmitting the optical wave generated in the gain area to an optical fiber, thereby being superior to the conventional wavelength tunable laser diode in the output optical efficiency.

Furthermore, in such a semiconductor laser, it is possible to widely tuning the wavelength and continuously or discontinuously tuning the wavelength in accordance with change of the refraction index in the phase control area of the SG-DFB structure portion and the SG-DBR area. Therefore, it is possible to easily control the wavelength with simple circuits.

What is claimed is:

1. A wavelength tunable semiconductor laser, comprising:
   a sampled grating distributed feedback Bragg (SG-DFB) structure portion including a gain area for generating an optical wave and a phase control area, the gain area having a sampled diffraction grating of a first period;
   a sampled grating distributed Bragg reflector (SG-DBR) structure portion being integrated with the SG-DFB structure portion and including a SG-DBR area having a sampled diffraction grating of a second period; and
   a non-reflection thin film being provided on one end surface of each of the SG-DFB structure portion and the SG-DBR structure portion,
   wherein an oscillated wavelength is tuned in accordance with change of refraction indexes of the phase control area and/or the SG-DBR area.

2. A wavelength tunable semiconductor laser according to claim 1, wherein the sampled diffraction grating of the first period and the sampled diffraction grating of the second period have the same pitches.

3. A wavelength tunable semiconductor laser according to claim 1, wherein the refraction indexes of the phase control area and the SG-DBR area are changed with applying current.

4. A wavelength tunable semiconductor laser according to claim 1, wherein the oscillated wavelength is continuously or discontinuously tuned.

5. A wavelength tunable semiconductor laser according to claim 1, wherein the wavelength tunable semiconductor laser and an optical modulator are integrated in one semiconductor substrate.

6. A wavelength tunable semiconductor laser, comprising:
   a substrate of a lower cladding layer;
   a gain area, a phase control area and a sampled grating distributed Bragg reflector (SG-DBR) area which are composed of different wave guide layers on the substrate;

an upper cladding layer being formed over the whole structure;

electrodes for independently applying voltages to a lower portion of the substrate, the gain area, the phase control area and the SG-DBR area; and a non-reflection thin film being formed on each end surface, wherein the gain area and phase control area, having a sampled diffraction grating of a first period, constitute a sampled grating distributed feedback Brang (SG-DFB) structure portion, and the SG-DBR area, having a sampled diffraction grating of a second period, constitute the SG-DBR structure portion; and wherein an oscillated wavelength is continuously or discontinuously tuned in accordance with change of refraction indexes caused by applying current to the phase control area and/or the SG-DBR area through the electrodes.

7. A wavelength tunable semiconductor laser according to claim 6, wherein the sampled diffraction grating of the first period and the sampled diffraction grating of the second period have the same pitches, and the first period and the second period are different.

8. A wavelength tunable semiconductor laser according to claim 6, wherein the substrate is an n type InP substrate, the wave guide layers are composed of an InGaAsP group material, and the upper cladding layer is a p type InP layer.

* * * * *